(12) United States Patent
Lin et al.

(10) Patent No.: US 7,969,168 B1
(45) Date of Patent: Jun. 28, 2011

(54) INTEGRATED CIRCUIT WITH BUILT-IN SELF TEST CIRCUIT

(75) Inventors: Chun-Yu Lin, Taipei Hsien (TW); Shiue-Shin Liu, HsinChu (TW); Hsin-Yi Chen, Hsin-Chu (TW); Kang-Nin Lin, Taipei (TW)

(73) Assignee: Mediatek Inc., Hsin-Chu (TW)

( * ) Notice: Subject to any disclaimer, the term of this patent is extended or adjusted under 35 U.S.C. 154(b) by 174 days.

(21) Appl. No.: 12/137,029

(22) Filed: Jun. 11, 2008

(51) Int. Cl.
*G01R 31/26* (2006.01)
*G01R 31/00* (2006.01)

(52) U.S. Cl. ............... 324/750.3; 324/762.01; 324/73.1

(58) Field of Classification Search .................. None
See application file for complete search history.

(56) References Cited

U.S. PATENT DOCUMENTS

| | | | |
|---|---|---|---|
| 6,321,320 B1 * | 11/2001 | Fleischman et al. | 711/217 |
| 6,408,412 B1 * | 6/2002 | Rajsuman | 714/724 |
| 6,642,736 B2 | 11/2003 | Mori et al. | |
| 6,925,408 B2 * | 8/2005 | Premy et al. | 702/120 |
| 7,222,261 B2 | 5/2007 | Song | |
| 7,315,177 B1 * | 1/2008 | Seif | 324/763 |
| 7,580,807 B2 * | 8/2009 | Bullock et al. | 702/117 |
| 7,673,198 B1 * | 3/2010 | Tu et al. | 714/724 |
| 2007/0096759 A1 | 5/2007 | Weinraub | |
| 2007/0220389 A1 * | 9/2007 | Sato | 714/733 |

* cited by examiner

*Primary Examiner* — Minh N Tang
(74) *Attorney, Agent, or Firm* — Thomas|Kayden

(57) ABSTRACT

An embodiment of the invention provides an integrated circuit. The integrated circuit has an analog device-under-test (DUT), a memory receiving and storing a test program and a processor. The processor tests the analog DUT and outputs a test result in digital format by executing the test program, wherein the test result indicates whether the analog DUT workable according to a specification.

24 Claims, 3 Drawing Sheets

INTEGRATED CIRCUIT WITH BUILT-IN SELF TEST CIRCUIT

BACKGROUND OF THE INVENTION

1. Field of the Invention

The invention relates to an integrated circuit, and more particularly to an integrated circuit with a built-in self test (BIST) module.

2. Description of the Related Art

A built-in self-test (BIST) mechanism within an integrated circuit (IC) is a function that verifies all or a portion of the internal functions of the IC. The main purpose of a BIST is to reduce complexity, and thereby decrease costs and reduce reliance upon external (pattern-programmed) test equipment. The BIST reduces cost in two ways: (1) reduces test-cycle duration; and (2) reduces the complexity of the test/probe setup, by reducing the number of I/O signals that must be driven or examined under a tester control. Both lead to a reduction in hourly charges for automated test equipment (ATE) services.

BRIEF SUMMARY OF THE INVENTION

An embodiment of the invention provides an integrated circuit with a built-in self test (BIST) module comprising an analog device-under-test (DUT), a memory receiving and storing a test program and a processor. The processor tests the analog DUT and outputs a test result in digital format by executing the test program, wherein the test result indicates whether the analog DUT workable according to a specification.

An embodiment of an analog circuit test method for an integrated circuit with a built-in self test (BIST) module and an auto-test equipment is disclosed. The method comprises on-line downloading a test program to a memory embedded in the integrated circuit; generating a test signal based on a device-under-test (DUT); inputting the test signal to the DUT; measuring output signals of the DUT; processing the output signals to generate a test result, wherein the control is transferred to the integrated circuit after the test program is completely downloaded.

An embodiment of an on-line test system comprises an auto-test equipment and an integrated circuit. The auto-test equipment outputs a test program. The integrated circuit comprises an analog logic unit, a memory, a processor, a test signal generator and a measuring unit. The memory receives and stores the test program. The processor executes the test program from the memory. The test signal generator inside the integrated circuit, controlled by the processor, generates and transmits an analog test signal to the analog logic unit. The measuring unit inside the integrated circuit, measures and transmits output signals of the analog logic unit, wherein the processor generates and transmits a test result in digital format to the auto-test equipment based on the output signals.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
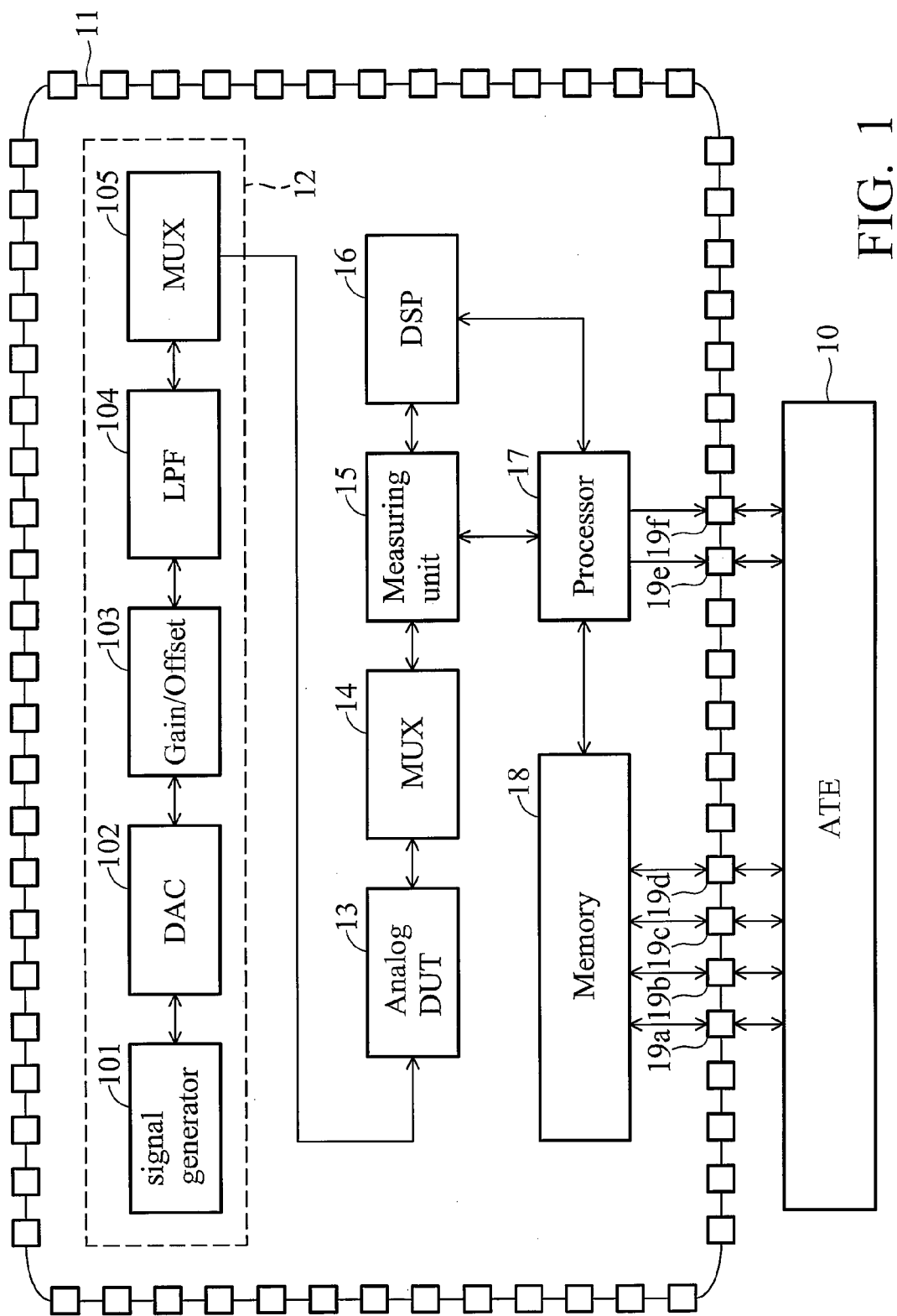
FIG. 1 is a block diagram of an embodiment of an integrated circuit with a built-in self test (BIST) circuit according to the invention.

FIG. 1 is a block diagram of an embodiment of an integrated circuit with a built-in self test (BIST) module according to the invention. The integrated circuit (IC) 11 comprises a test signal generator 12, an MUX (multiplexer) 105, an analog device-under-test (DUT) 13, a multiplexer 14, a measuring unit 15, a digital signal processor 16, a processor 17, a memory 18, first general purpose input/output (GPIO) pins 19a to 19d, and second GPIO pins 19e and 19f. At first, an auto-test equipment (ATE) 10 outputs control signals via second GPIO pins to halt the processor 17 and transmits the test program to the memory 18 via first GPIO pins 19a to 19d, wherein the integrated circuit (IC) 11 may be on a wafer. In another embodiment, the start address in the memory 18 for storing the test program can be assigned by controlling the first GPIO pins 19a to 19d. After the test program is downloaded, the processor 17 is activated by the ATE 10. The processor 17 fetches and executes the test program stored in the memory 18 and controls the test signal generator 12 to generate a test signal in analog format.

In this embodiment, the test signal generator 12 has several units to process signals for testing relative functions of the integrated circuit, such as signal generator 101, DAC (digital-to-analog converter) 102, gain/offset unit 103, LPF (low pass filter) 104. The signal generator 101 is controlled by the processor 17 and outputs a digital test signal based on the test function of the test program and the type of the analog DUT 13. The digital-to-analog converter 102 converts the digital test signal to an analog test signal, and the gain/offset unit 103 and the low pass filter 104 are used to adjust the amplitude of the analog test signal, remove unwanted parts of the analog test signal, and finally generate the test pattern. During the test procedure, the test program may have many functions and the signal generator 101 therefore has to generate corresponding test signals.

The measuring unit 15 measures and converts the output signals to digital data. Since the output signal from the analog DUT 13 may be analog signal, thus, an ADC (analog-to-digital converter, not shown) is required to convert the output signal of the analog DUT 13 into digital data. The ADC converter may be embedded in the measuring unit 15 or located between the measuring unit 15 and analog DUT 13 to convert analog signals to digital signals.

Then, the processor 17 generates the test result based on the digital data and outputs the test result to the ATE 10 via the second GPIO pins 19e and 19f, wherein the test result generated by the processor 17 can be digital format. Further more, the digital data can further be transmitted to the digital signal processor 16 for frequency domain processing.

It is noted that some parts of the integrated circuit 11 with required functions can be taken as the test signal generator 12; therefore the integrated circuit 11 doesn't need to be implemented with extra parts for the BIST module. Otherwise, if the integrated circuit 11 doesn't have the parts with required functions, the integrated circuit 11 needs to be implemented with extra parts for the BIST module, and the extra parts (such as DAC, gain/offset unit, LPF, or the test pattern generator) are dummy when the integrated circuit 11 is out of test.

In this embodiment, the data transmitted via the GPIO pins 19*a* to 19*f* are digital data, and the ATE 10 therefore can be full digitalized. This kind of digitalization simplifies the design of the ATE 10 and reduces the cost of the ATE 10. Moreover, the test method is based on the internal clock of the integrated circuit 11 and the test speed therefore increases. Furthermore, the test pattern generator 12 and the measuring unit 15 are embedded in the integrated circuit 11, so that the analog error due to the transmission between the integrated circuit 11 and the load board can be reduced.

According to the described architecture, the ATE 10 only monitors the GPIO pins 19*e* and 19*f* to receive the digital test results without measuring and determining whether the analog signals are desired. The digital test result may indicate only whether the analog DUT 13 passes or fails in this test. However, one test program may contains many test functions, therefore, the test results may contain many data fields, respectively corresponding to test functions, containing pass or fail test result. When ATE 10 detects the test program is finished by monitoring the GPIO pins 19*e* and 19*f*, the ATE 10 can immediately download another test program to the integrated circuit 11 to achieve on-line update.

The above descriptions are illustrated with the test results which have been processed by the processor 17, in other words, the test results comprises the test pass or failure information according to specification. For example, the analog DUT 13 is a gain stage and the processor 17 converts the output signal from the analog DUT 13 to digitalized signals. ATE 11 receives the digitalized signals and determines whether the analog DUT 13 passes the test function.

Figure 2:
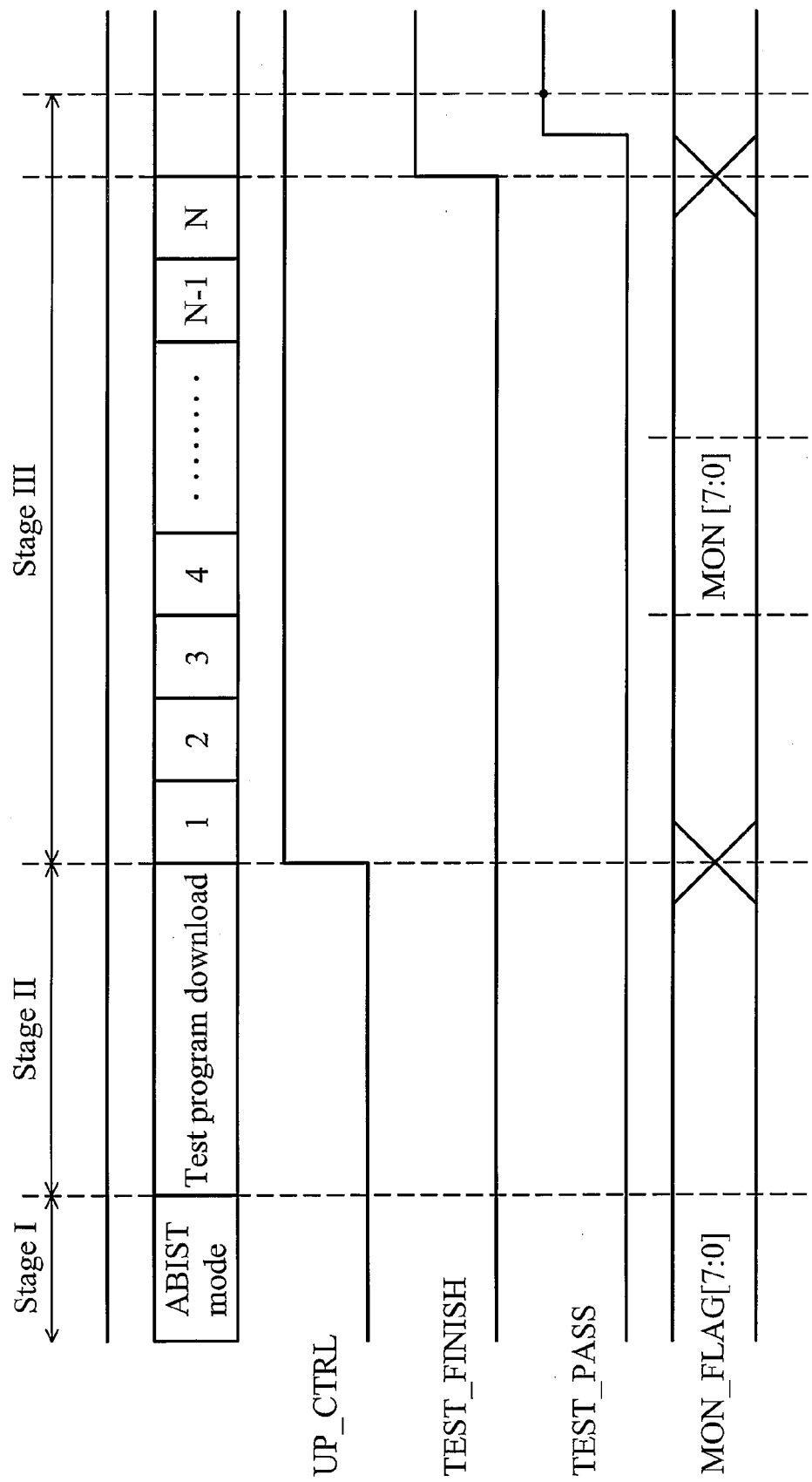
FIG. 2 is a timing diagram of the test procedure according to an embodiment of the invention.

FIG. 2 is a timing diagram of the test procedure according to an embodiment of the invention. During stage I, the auto-test equipment (ATE) controls the under-test IC to enter the BIST mode. During stage II, the under-test integrated circuit receives the test program downloaded from the ATE. During stage III, the micro-controller embedded in the integrated circuit carries on the task of control, and the signal UP_CTRL is asserted. The micro-controller executes the test program and the numerals 1, 2, 3 . . . N represent different test functions. After the Nth test function is executed, the test procedure is finished and the signal TEST_FINISH is asserted. The micro-controller checks whether the test passes or not and outputs the test result via signal TEST_PASS. In this embodiment, the signal TEST_PASS asserts that the test result is passing. The MON_FLAG[7:0] represents the output of pins of the under-test IC and the ATE can monitor the pins to acquire test result.

The MON_FLAG[7:0] represents the test results corresponding to the test functions, or the test parameters. This information can be provided to the ATE 10 for debugging. In the stage II, the numeral 1, 2, 3 . . . N represent different test functions, wherein the functions may be gain adjustment, offset adjustment, noise cancellation or other similar functions.

Figure 3:
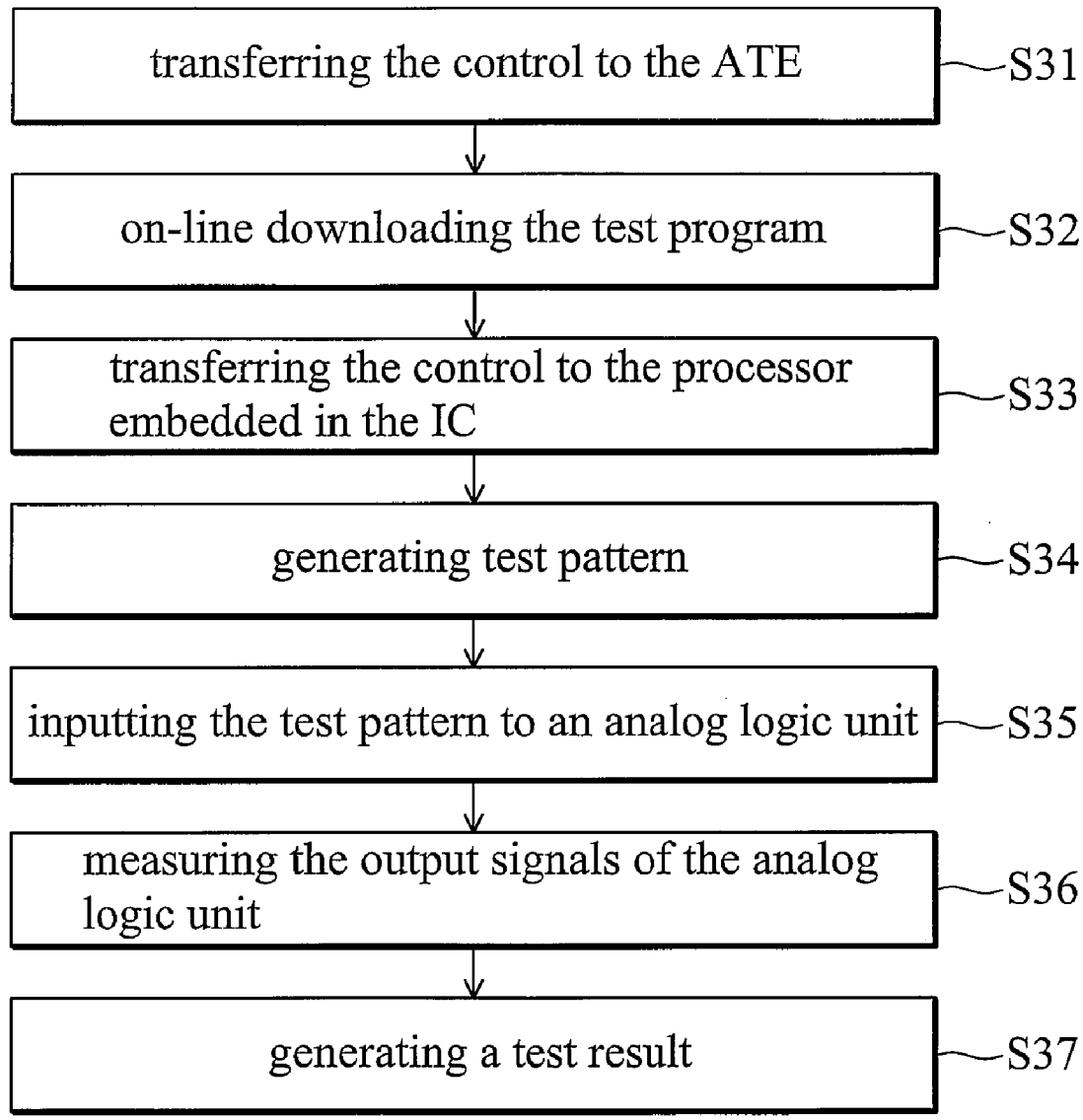
FIG. 3 is a flowchart of an embodiment of an on-line test method for auto-test equipment and an under-test integrated circuit.

FIG. 3 is a flowchart of an embodiment of an on-line test method for auto-test equipment and an under-test integrated circuit. In step S31, the auto-test equipment (ATE) sends a control signal to the under-test integrated circuit (IC) to obtain control. In step S31, the test program is downloaded to a memory embedded in the under-test IC. The ATE can assign the memory addresses for the test memory by controlling a plurality of general purpose input/output (GPIO) pins. In another example, the start address for the test program can be assigned by an address generator embedded in the under-test IC. After the test program is downloaded, the control is transferred to a processor embedded in the under-test IC in step S33.

Then, the processor fetches and executes the test program from the memory and controls a signal generator to generate a test pattern (or test signal) in step S34. In step S35, the test pattern (or test signal) is input to an under-test unit of the under-test IC, the under-test unit is taken as an analog logic unit for example here. In step S36, a measuring unit is applied to measure and convert the output signals of the under-test analog logic unit to digital data. In step S37, the processor processes the digital data to generate a test result and the ATE determines whether the under-test unit passes or fails based on the test result. Furthermore, the test result may be converted to a specific format which can be read by the ATE.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An integrated circuit, coupled to an auto test equipment, comprising:
   an analog device-under-test (DUT);
   a memory, receiving and storing a test program;
   a processor, testing the analog DUT according to a series of testing functions by executing the test program, and outputting a test result indicating whether the analog DUT passes or fails the testing functions via at least one GPIO pin to the auto test equipment; and
   an analog-to-digital converter, receiving and converting the output signals of the analog DUT to be digital data, wherein the processor generates the test result based on the digital data.

2. The circuit as claimed in claim 1, further comprising a test signal generator for generating and transmitting a test signal to the analog DUT.

3. The circuit as claimed in claim 2, wherein the test signal generator is dummy when the integrated circuit is out of test.

4. The circuit as claimed in claim 2, wherein the integrated circuit is on a wafer.

5. The circuit as claimed in claim 2, wherein the test signal generator comprises:
   a signal generator, generating a digital test signal; and
   a digital-to-analog converter, converting the digital test signal into an analog test signal.

6. The circuit as claimed in claim 2, wherein the test signal is generated based on the analog DUT and an under-tested function of the test program.

7. The circuit as claimed in claim 1, further comprising:
   a test signal generator inside the integrated circuit, generating a plurality of test signals; and
   a multiplexer, receiving the test signals and outputting a first test signal based on the control of the processor.

8. The circuit as claimed in claim 7, wherein the test signal generator is dummy when the integrated circuit is out of test.

9. The circuit as claimed in claim 1, wherein the test program is on-line transmitted from auto-test equipment.

10. The circuit as claimed in claim 1, wherein the test program or the test result is transmitted through a single pin.

11. The circuit as claimed in claim 1, further comprising a digital signal processor for frequency domain processing.

12. An analog circuit test method for an integrated circuit, coupled to an auto test equipment, comprising:
- on-line downloading a test program to a memory embedded in the integrated circuit;
- generating a test signal based on a series of testing functions;
- inputting the test signal to a device-under-test (DUT);
- converting output signals of the DUT to be digital data by an analog-to-digital converter; and
- processing the digital data derived from the output signals to generate a test result indicating whether the DUT passes or fails the testing functions to be output via at least one GPIO in to the auto test equipment.

13. The method as claimed in claim 12, wherein the test signal is generated inside the integrated circuit.

14. The method as claimed in claim 12, wherein the output signals are measured inside the integrated circuit.

15. The method as claimed in claim 12, wherein the output signals are processed to generate the test result inside the integrated circuit.

16. The method as claimed in claim 12, wherein the test result is digital data or ASCII code.

17. An on-line test system, comprising:
- an auto-test equipment, outputting a test program; and
- an integrated circuit, comprising:
  - an analog under test (DUT);
  - a memory, receiving and storing the test program;
  - a processor, executing the test program from the memory, and outputting a test result indicating whether the analog DUT passes or fails the testing functions via at least one GPIO pin to the auto-test equipment;
  - a test signal generator inside the integrated circuit, controlled by the processor, generating and transmitting an analog test signal according to a series of testing functions to the analog DUT; and
  - an analog-to-digital converter receiving and converting the output signals of the analog DUT to be digital data, wherein the processor generates the test result based on the digital data.

18. The circuit as claimed in claim 17, wherein the test signal generator is dummy when the integrated circuit is out of test.

19. The system as claimed in claim 17, wherein the processor is halted when the test program is downloaded to the memory.

20. The system as claimed in claim 17, wherein the test signal is generated based on the analog DUT and an under-tested function of the test program.

21. The system as claimed in claim 17, wherein the test signal generator further comprises:
- a signal generator, generating a digital test signal; and
- a digital-to-analog converter, converting the digital test signal into the analog test signal.

22. The system as claimed in claim 17, wherein the test result is digital data or ASCII code.

23. The system as claimed in claim 17, wherein the integrated circuit further comprises a digital signal processor for frequency domain processing.

24. An integrated circuit, coupled to an auto test equipment, comprising:
- an analog device-under-test (DUT);
- a memory, receiving and storing a test program;
- a processor, testing the analog DUT according to a series of testing functions by executing the test program, and outputting a test result indicating whether the analog DUT passes or fails the testing functions via at least one GPIO pin to the auto test equipment; and
- a measuring unit, measuring and converting output signals of the analog DUT to be digital data after the analog DUT receives a test pattern, wherein the processor generates the test result based on the digital data.

* * * * *